US012413186B2

(12) United States Patent
Roblin et al.

(10) Patent No.: US 12,413,186 B2
(45) Date of Patent: Sep. 9, 2025

(54) 3-WAY DUAL-BAND DOHERTY POWER AMPLIFIER

(71) Applicant: Ohio State Innovation Foundation, Columbus, OH (US)

(72) Inventors: Patrick Roblin, Columbus, OH (US); Ruwaybih Alsulami, Columbus, OH (US)

(73) Assignee: Ohio State Innovation Foundation, Columbus, OH (US)

( * ) Notice: Subject to any disclaimer, the term of this patent is extended or adjusted under 35 U.S.C. 154(b) by 675 days.

(21) Appl. No.: 17/572,016

(22) Filed: Jan. 10, 2022

(65) Prior Publication Data

US 2022/0294394 A1 Sep. 15, 2022

Related U.S. Application Data

(60) Provisional application No. 63/159,091, filed on Mar. 10, 2021.

(51) Int. Cl.
*H03F 1/02* (2006.01)
*H03F 3/21* (2006.01)

(52) U.S. Cl.
CPC .......... *H03F 1/0288* (2013.01); *H03F 3/211* (2013.01)

(58) Field of Classification Search
CPC .. H03F 1/0288; H03F 3/211; H03F 2200/408; H03F 2200/451
USPC ............................................ 330/295, 124 R
See application file for complete search history.

(56) References Cited

U.S. PATENT DOCUMENTS

| | | | | |
|---|---|---|---|---|
| 5,786,727 A | * | 7/1998 | Sigmon | H03F 1/0288 330/124 R |
| 6,252,461 B1 | * | 6/2001 | Raab | H03F 1/565 330/306 |
| 7,602,241 B2 | * | 10/2009 | Suzuki | H03F 1/0288 330/124 R |
| 2015/0022270 A1 | * | 1/2015 | Outaleb | H03F 3/604 330/295 |
| 2015/0145601 A1 | * | 5/2015 | Moronval | H03F 1/07 330/295 |

FOREIGN PATENT DOCUMENTS

JP 2014241488 A * 12/2014 ............ H03F 1/07

OTHER PUBLICATIONS

Doherty, "A New High Efficiency Power Amplifier for Modulated Waves," Proceedings of the Institute of Radio Engineers, vol. 24, No. 9, pp. 1163-1182, 1936.

(Continued)

*Primary Examiner* — Andrea Lindgren Baltzell
*Assistant Examiner* — Khiem D Nguyen
(74) *Attorney, Agent, or Firm* — Meunier Carlin & Curfman LLC (57) ABSTRACT

A multi-band Doherty power amplifier (DPA) is provided. A dual-band Doherty power amplifier (DB-DPA) is based on a 3-way architecture and comprises a main amplifier for each band and an auxiliary amplifier handling both bands. The 3-Way DB-DPA improves the average drain efficiency in concurrent dual-band operation compared to the traditional 2-Way DB-DPA, by avoiding early clipping in the main amplifiers, while benefiting from load-pulling from the auxiliary power amplifier.

16 Claims, 7 Drawing Sheets

(56) References Cited

OTHER PUBLICATIONS

Raab, "Efficiency of Doherty RF Power-Amplifier Systems," IEEE transactions on Broadcasting, No. 3, pp. 77-83, 1987.

Kim, J. Kim, I. Kim, and J. Cha, "The Doherty Power Amplifier," IEEE microwave magazine, vol. 7, No. 5, pp. 42-50, 2006.

Kim, "Highly Efficient Asymmetric Class-F-1/F GaN Doherty Amplifier" IEEE Transactions on Microwave Theory and Techniques, vol. 66, No. 9, pp. 4070-4077, 2018.

Jang, P. Roblin, C. Quindroit, Y. Lin, and R. D. Pond, "Asymmetric Doherty Power Amplifier Designed Using Model-Based Nonlinear Embedding," IEEE Transactions on Microwave Theory and Techniques, vol. 62, No. 12, pp. 3436-3451, 2014.

Liang, P. Roblin, and Y. Hahn, "Accelerated Design Methodology for Dual-Input Doherty Power Amplifiers," IEEE Transactions on Microwave Theory and Techniques, vol. 67, No. 10, pp. 3983-3995, 2019.

Ozen, K. Andersson, and C. Fager, "Symmetrical Doherty Power Amplifier With Extended Efficiency Range," IEEE Transactions on Microwave Theory and Techniques, vol. 64, No. 4, pp. 1273-1284, 2016.

Colantonio, F. Feudo, F. Giannini, R. Giofr'e, and L. Piazzon, "Design of a Dual-Band GaN Doherty Amplifier," in 18-th International Conference On Microwaves, Radar And Wireless Communications. IEEE, Jun. 14-16, 2010, pp. 1-4.

Chen, S. A. Bassam, X. Li, Y. Liu, K. Rawat, M. Helaoui, F. M. Ghannouchi, and Z. Feng, "Design and Linearization of Concurrent Dual-Band Doherty Power Amplifier With Frequency-Dependent Power Ranges," IEEE Transactions on Microwave Theory and Techniques, vol. 59, No. 10, pp. 2537-2546, 2011.

Yang, M. Li, Y. Yao, Z. Dai, T. Li, and Y. Jin, "Design of Concurrent Dual-Band Continuous Class-J Mode Doherty Power Amplifier With Precise Impedance Terminations," IEEE Microwave and Wireless Components Letters, vol. 29, No. 5, pp. 348-350, 2019.

Liu, H. Golestaneh, and S. Boumaiza, "A Concurrent 2.15/3.4 GHz Dual-Band Doherty Power Amplifier With Extended Fractional Bandwidth," in 2016 IEEE MTT-S International Microwave Symposium (IMS). IEEE, 2016, pp. 1-3.

Li, W. Chen, Z. Zhang, Z. Feng, X. Tang, and K. Mouthaan, "A Concurrent Dual-Band Doherty Power Amplifier," in 2010 Asia-Pacific Microwave Conference. IEEE, 2010, pp. 654-657.

Chen,W. Chen, G. Su, F. M. Ghannouchi, and Z. Feng, "A Concurrent Dual-Band 1.9-2.6-GHz Doherty Power Amplifier With Intermodulation Impedance Tuning," in 2014 IEEE MTT-S International Microwave Symposium (IMS2014). IEEE, 2014, pp. 1-4.

Saad, R. Hou, R. Hellberg, and B. Berglund, "A 1.8-3.8-GHz Power Amplifier With 40% Efficiency at 8-dB Power Back-Off," IEEE Transactions on Microwave Theory and Techniques, vol. 66, No. 11, pp. 4870-4882, 2018.

Chen, S. Zhang, Y. Liu, Y. Liu, and F. M. Ghannouchi, "A Concurrent Dual-Band Uneven Doherty Power Amplifier with Frequency-Dependent Input Power Division," IEEE Transactions on Circuits and Systems I: Regular Papers, vol. 61, No. 2, pp. 552-561, 2013.

Barthwal, G. Ajmera, K. Rawat, A. Basu, and S. K. Koul, "Design Scheme for Dual-Band Three Stage Doherty Power Amplifiers," in 2014 IEEE International Microwave and RF Conference (IMaRC). IEEE, 2014, pp. 80-83.

Pang, S. He, Z. Dai, C. Huang, J. Peng, and F. You, "Novel Design of Highly-Efficient Concurrent Dual-Band GaN Doherty Power Amplifier Using Direct-Matching Impedance Transformers," in 2016 IEEE MTT-S International Microwave Symposium (IMS). IEEE, 2016, pp. 1-4.

Chen, W. Chen, F. Huang, F. M. Ghannouchi, Z. Feng, and Y. Liu, "Systematic Crest Factor Reduction and Efficiency Enhancement of Dual-Band Power Amplifier Based Transmitters," IEEE Transactions on Broadcasting, vol. 63, No. 1, pp. 111-122, 2016.

Duffy, G. Lasser, M. Olavsbr°aten, E. Berry, and Z. Popovi'c, "Efficient Multisignal 2-4-GHz Power Amplifier With Power Tracking," IEEE Transactions on Microwave Theory and Techniques, vol. 66, No. 12, pp. 5652-5663, 2018.

Jang, P. Roblin, and C. Quindroit, "Adjustable load-modulation asymmetric doherty amplifier design using nonlinear embedding," in 2014 IEEE MTT-S International Microwave Symposium (IMS2014). IEEE, 2014, pp. 1-4.

Liang, P. Roblin, Y. Hahn, Z. Popovic, and H.-C. Chang, "Novel outphasing power amplifiers designed with an analytic generalized doherty-chireix continuum theory," IEEE Transactions on Circuits and Systems I: Regular Papers, vol. 66, No. 8, pp. 2935-2948, 2019.

Jang, P. Roblin, and Z. Xie, "Model-based nonlinear embedding for power-amplifier design," IEEE Transactions on Microwave Theory and Techniques, vol. 62, No. 9, pp. 1986-2002, 2014.

Chen, S. Zhang, and W. Chen, "Two-dimensional crest factor reduction for performance improvement of concurrent dual-band power amplifiers," Electronics letters, vol. 49, No. 18, pp. 1163-1165, 2013.

Saad, P. Colantonio, L. Piazzon, F. Giannini, K. Andersson, and C. Fager, "Design of a concurrent dual-band 1.8-2.4-ghz gan-hemt doherty power amplifier," IEEE Transactions on microwave theory and techniques, vol. 60, No. 6, pp. 1840-1849, 2012.

Cappello, A. Duh, T. W. Barton, and Z. Popovic, "A dual-band dualoutput power amplifier for carrier aggregation," IEEE Transactions on Microwave Theory and Techniques, vol. 67, No. 7, pp. 3134-3146, 2019.

* cited by examiner

3-WAY DUAL-BAND DOHERTY POWER AMPLIFIER

CROSS-REFERENCE TO RELATED APPLICATIONS

This application claims the benefit of U.S. provisional patent application No. 63/159,091, filed on Mar. 10, 2021, and entitled "MULTI-BAND DOHERTY POWER AMPLIFIER WITH ONE MAIN AMPLIFIER PER BAND AND A SINGLE SHARED MULTI-BAND AUXILIARY AMPLIFIER FOR CONCURRENT OPERATION WITH ENHANCED POWER EFFICIENCY AND REDUCED TRANSISTOR COUNT," the disclosure of which is expressly incorporated herein by reference in its entirety.

STATEMENT OF GOVERNMENT SUPPORT

This invention was made with government support under 1952907 awarded by the National Science Foundation. The government has certain rights in the invention.

BACKGROUND

With the rapid growth in modern communication, transmitter systems must use a wider fraction of the spectrum, to support the continuously increasing data rate. In addition, signals with large peak-to-average power ratio (PAPR) are used in communication systems to increase the spectral efficiency. This has led to an increase demand for multi-band and broadband power amplifiers (PA) for signals with large PAPR.

The PA is one of the most power-consuming components in a transmitter system, and thus it is desirable to achieve high average power efficiency, for signals with large PAPR. Therefore, a Doherty PA (DPA) is widely used because it exhibits a high efficiency over an extended back-off power range. For single-band operation, the DPA has been studied extensively, and it has been shown that it can achieve high average efficiency for signals with large PAPR. For the multi-band operation mode, the conventional DPA faces significant challenges to achieve high average efficiency. In recent years, efforts have been made to improve the average efficiency by introducing new design techniques and methodologies. As a result, the drain efficiency and PAPR of these DB-DPAs have been significantly improved. However, this conventional DB-DPA works focuses on improving the drain efficiency of each band instead of the total average efficiency under concurrent operation.

It is with respect to these and other considerations that the various aspects and embodiments of the present disclosure are presented.

SUMMARY

A type of multi-band Doherty power amplifier (DPA) for applications such as cellular phone base station is provided. A dual-band Doherty power amplifier (DB-DPA) described herein is based on a 3-way architecture and comprises a main amplifier for each band and an auxiliary amplifier handling both bands. The 3-Way DB-DPA improves the average drain efficiency in concurrent dual-band operation compared to the traditional 2-Way DB-DPA, by avoiding early clipping in the main amplifiers, while benefiting from load-pulling from the auxiliary power amplifier.

In an implementation, a dual-band Doherty power amplifier (DB-DPA) comprises: a first main amplifier for a first band; a second main amplifier for a second band; and an auxiliary amplifier configured to handle the first band and the second band.

In an implementation, an N-band Doherty power amplifier comprises N inputs and N outputs with a shared auxiliary power amplifier topology, wherein N is an integer, and comprises N main power amplifiers and 1 auxiliary power amplifier.

In an implementation, an N-band Doherty power amplifier comprises 2N inputs and N outputs with a shared auxiliary power amplifier topology, wherein N is an integer, and comprises N main power amplifiers and 1 auxiliary power amplifier.

This summary is provided to introduce a selection of concepts in a simplified form that are further described below in the detailed description. This summary is not intended to identify key features or essential features of the claimed subject matter, nor is it intended to be used to limit the scope of the claimed subject matter.

BRIEF DESCRIPTION OF THE DRAWINGS

The foregoing summary, as well as the following detailed description of illustrative embodiments, is better understood when read in conjunction with the appended drawings. For the purpose of illustrating the embodiments, there is shown in the drawings example constructions of the embodiments; however, the embodiments are not limited to the specific methods and instrumentalities disclosed. In the drawings.

DETAILED DESCRIPTION

This description provides examples not intended to limit the scope of the appended claims. The figures generally indicate the features of the examples, where it is understood and appreciated that like reference numerals are used to refer to like elements. Reference in the specification to "one embodiment" or "an embodiment" or "an example embodiment" means that a particular feature, structure, or characteristic described is included in at least one embodiment described herein and does not imply that the feature, structure, or characteristic is present in all embodiments described herein.

A dual-band Doherty power amplifier (DB-DPA) described herein is based on a 3-way architecture and comprises a main amplifier for each band and an auxiliary amplifier handling both bands.

Figure 1:
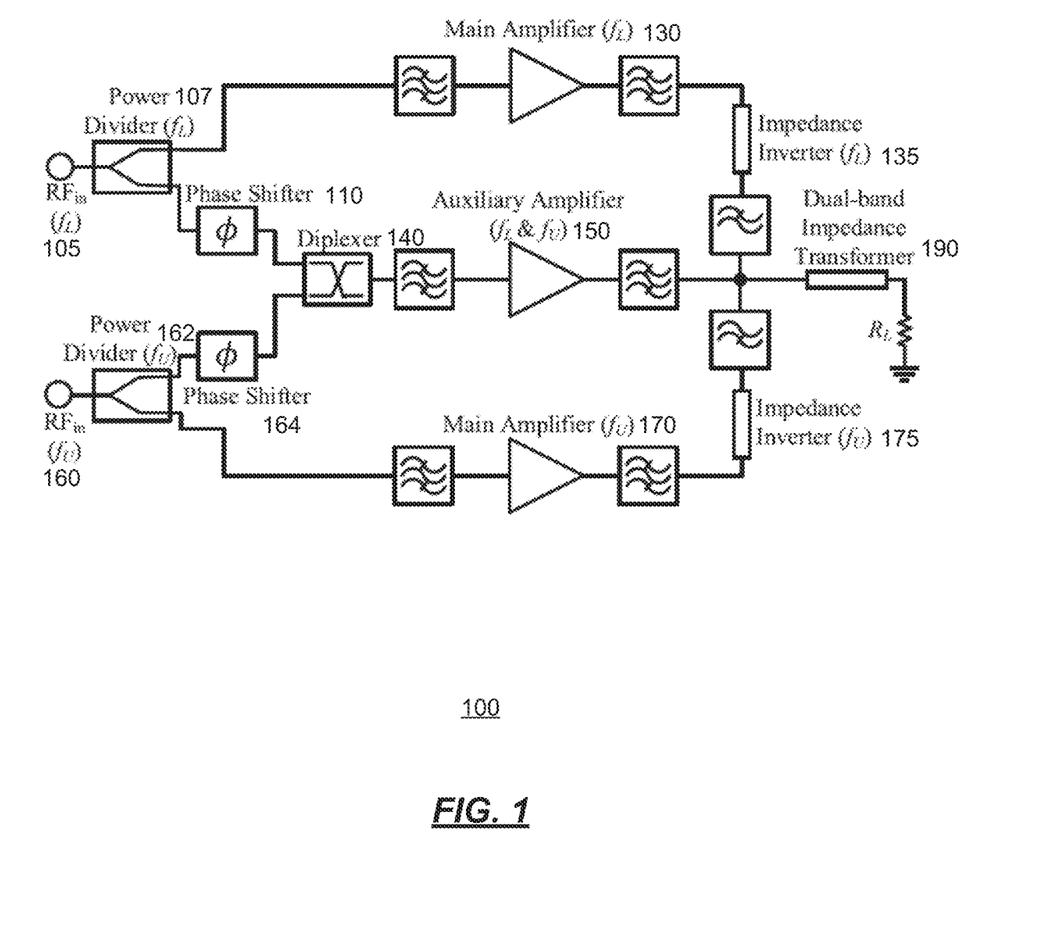
FIG. 1 illustrates a diagram of an implementation of a 3-Way dual-band Doherty power amplifier (DB-DPA)

FIG. 1 illustrates a diagram of an implementation of a 3-Way DB-DPA 100. The DB-DPA 100 comprises three amplifiers (three ways) 130, 150, 170. The two amplifiers 130, 170 are used as main (carrier) amplifiers, which both operate in class F in some implementations. The amplifier 150 is the auxiliary (peaking) amplifier, which is shared by the two-band signals and operates in class C in some implementations.

Each main amplifier 130, 170 handles signals individually at either the lower band centered at $f_L$ or the upper band centered at $f_U$ to avoid early clipping. This results in both higher power gain and total output power in the concurrent mode. Thus, the addition of a second main amplifier (e.g., the main amplifier 170) increases the total concurrent output power while also improving the concurrent total efficiency compared to the 2-Way DB-DPA. The absence of intermodulation (IM) products in the main PAs that normally arise in the 2-Way DPA in dual-band operation also greatly simplifies the design of their matching networks. However, the second-order IM products at the frequencies $f_U - f_L$ and $f_L + f_U$ need to be properly terminated at the output of the auxiliary amplifier to further improve the DB-DPA's performance. In an implementation, a short may be an optimal termination.

The impedance inverters 135, 175 of the main amplifiers 130, 170 of the DB-DPA 100 are integrated as a part of their output combiner. In the output combiner, a diplexer realized with low-pass and high-pass filters is used to distribute the lower band and upper band load-pull signals between the main amplifiers 130, 170 so that no IM products are created.

At the output of the 3-Way DB-DPA 100, a dual-band impedance transformer 190 is integrated as a part of the output power combiner. At the input of the 3-Way DB-DPA, two Wilkinson power dividers (WPDs) 107, 162 with uneven power ratio are designed for each RF band to divide the input power 105, 160 between the main amplifiers 130, 170 and the auxiliary amplifier 150. At the gate of the main amplifiers 130, 170, a matching network that includes a proper termination for the input second harmonic is designed for the lower band and upper band signals.

In addition, two 90° phase shifters 110, 164 are used in the auxiliary branch after the WPDs 107, 162 as shown in FIG. 1 to compensate for the phase offset between the main amplifiers 130, 170 and auxiliary amplifiers 150 introduced by the inverters. After the phase shifters 110, 164, a diplexer 140 is implemented at the input of the auxiliary amplifier 150 to combine both signals and prevent the lower band signal from going to the upper band main amplifier and vice versa. A dual-band matching network that includes the termination of the lower band and upper band second harmonic is implemented at the gate of the auxiliary transistor.

In the 3-Way DB-DPA, the main amplifiers 130, 170 handle each band separately, whereas the auxiliary amplifier 150 is shared by the two lower and upper band signals. Therefore, these two continuous-wave (CW) signals will be beating at the auxiliary amplifier 150: the two CW signals add up constructively when they are in-phase and cancel when they are out-of-phase. Accounting for the gate $V_{GG}$ and drain $V_{DD}$ dc bias voltages, the gate $v_{GS,a}(t)$ and drain $v_{DS,a}(t)$ voltage waveforms at the auxiliary transistor are expressed as follows:

$$v_{GS,a}(t) = V_{GG} + |V_{GSa,L}|\cos(2\pi f_L t) + |V_{GSa,U}|\cos(2\pi f_U t + \delta\phi)$$

$$v_{DS,a}(t) = V_{DD} + |V_{a,L}|\cos(2\pi f_L t + \pi) + |V_{a,U}|\cos(2\pi f_U t + \pi + \delta\phi),$$

where the phase of the first band is set to zero and the phase of the second band is set to the phase offset $\delta\phi$ between the lower and upper band CW signals to simplify the notation.

Figure 2A:
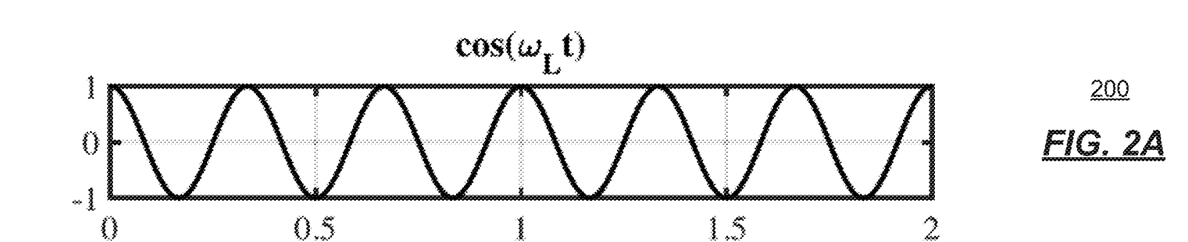
FIGS. 2A, 2B, and 2C illustrate diagrams of continuous-wave (CW) signals for the lower band and upper band with different phase offsets and combined waveforms, respectively.
Figure 2B:
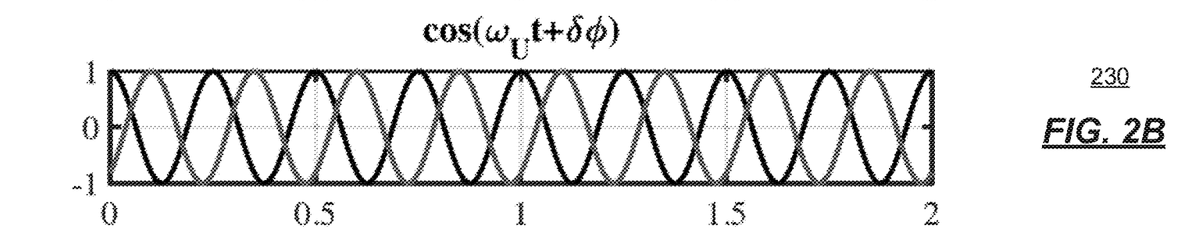
Figure 2C:
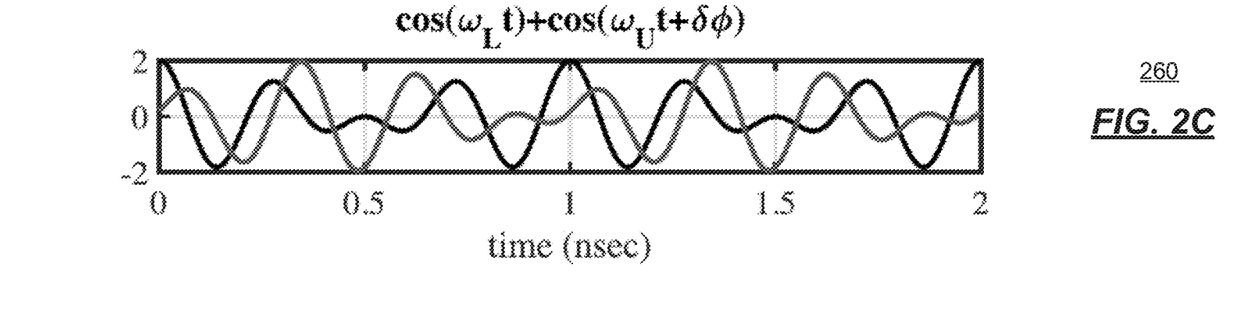

FIGS. 2A, 2B, and 2C illustrate diagrams of CW signals for the lower band 200 and upper band 230 with different phase offsets and combined waveforms 260, respectively. The lower band and upper band CW signals are plotted for two different phase offsets $\delta\phi$ for the upper band signal. As the phase offset varies, the combined waveforms exhibit a similar constructive and destructive behavior in concurrent (C) operation.

The cosine sub-waveforms will constructively add when in-phase to nearly the same maximum and minimum values, independently of the phase offset, $$v_{GS,a}^{max}(C) = V_{GG} + (|V_{GSa,L}| + |V_{GSa,U}|)$$

$$v_{DS,a}^{min}(C) = V_{DD} - (|V_{a,L}| + |V_{a,U}|).$$

The RF drives $V_{GSa,L/U}$, for which the maximum gate voltage is the threshold voltage: $v_{GS,a}^{max}(C) = V_T$, will determine the backoff condition at which the auxiliary transistor turns on in dual-band operation. Similarly, the RF drives, for which the minimum drain voltage reaches the transistor knee voltage: $v_{DS,a}^{min}(C) = V_{on}$, will determine the threshold at which the auxiliary transistor output voltage will start clipping in dual-band operation.

Figure 3:
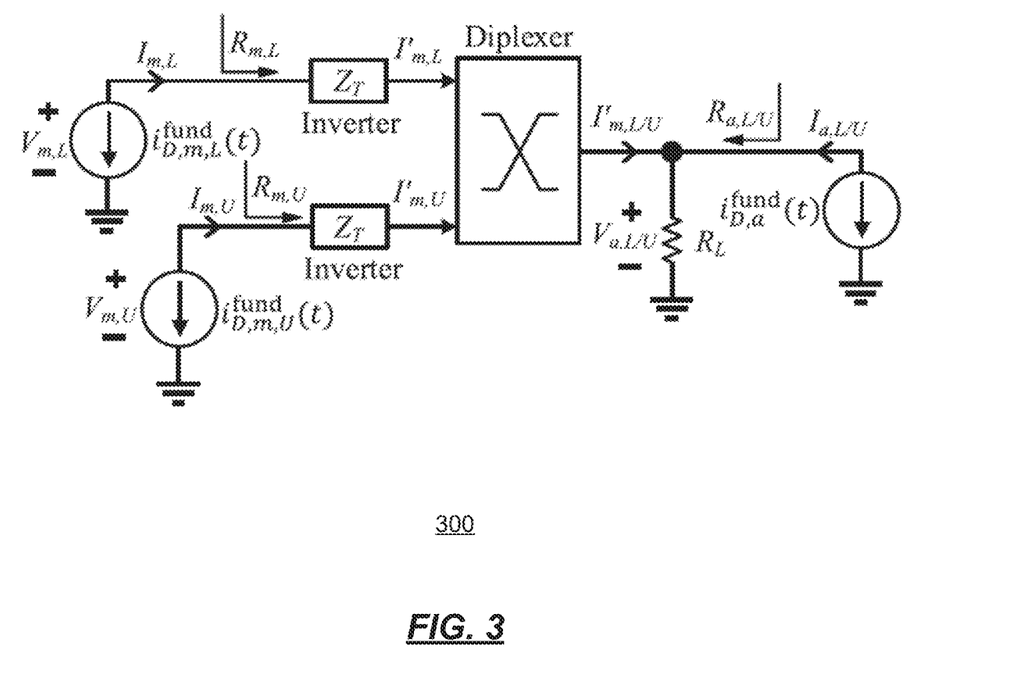
FIG. 3 illustrates a diagram of an implementation of a 3-Way DB-DPA at the drain current-source reference plane for the fundamental frequencies.

The design equations of an implementation of a 3-Way DB-DPA may be derived at the current-source reference plane (CSRP) of the transistors. The transistors are modeled by current sources representing the I-V characteristics at the CSRP. FIG. 3 illustrates a diagram of an implementation of a 3-Way DB-DPA 300 at the drain current-source reference plane for the fundamental frequencies.

In the 3-Way DB-DPA 300, two main amplifiers are used such that each main amplifier handles an SB. The fundamental drain voltages and currents of the two main transistors at the lower band and upper band are noted as $V_{m,L}$ and $V_{m,U}$ and $I_{m,L}$ and $I_{m,U}$, respectively. The fundamental drain voltages and currents of the single auxiliary transistor at the lower band and upper band are noted as $V_{a,L}$ and $V_{a,U}$ and $I_{a,L}$ and $I_{a,U}$, respectively. The fundamental drain currents in the time domain for the 3-Way DB-DPA are then given by $$i_{D,m,L/U}^{fund}(t) = \text{Re}\{I_{m,L/U} e^{j\omega_{L/U} t}\}$$

$$i_{D,a}^{fund}(t) = \text{Re}\{I_{a,L} e^{j\omega_L t} + I_{a,U} e^{j\omega_U t}\}.$$

The 3-Way DB-DPA will behave as a normal Doherty PA when operating in the single-band (SB) mode and as a modified Doherty PA in the concurrent operation. In concurrent-balanced (CB) operation, the auxiliary transistor will turn on earlier and the DB-DPA exhibits an early backoff occurring at the fundamental main gate voltage $V_{GSm,b1}$ noted with the subscript b1. In SB operation, the DB-DPA exhibits a later backoff at the fundamental main gate voltage drive $V_{GSm,b2} = 2 \times V_{GSm,b1}$ noted with the subscript b2.

The 3-Way DB-DPA exhibits two different peak operations in the SB and CB modes. In CB operation, the DB-DPA saturates earlier, at the fundamental main gate voltage $V_{GSm,p1}$. In SB operation, the DB-DPA saturates later on, at the fundamental main gate voltage $V_{GSm,p2}$. The associated saturation voltages and currents are noted: $V_{mp1}$, $V_{mp2}$, $I_{mp1}$, and $I_{mp2}$ for the main transistors and $V_{ap1}$, $V_{ap2}$, $I_{ap1}$, and $I_{ap2}$ for the auxiliary transistor, respectively.

Note that in both CB and SB modes, the lower band and upper band voltages and currents have the same amplitudes at the CSRP.

The 3-Way DB-DPA improves the average drain efficiency in concurrent dual-band operation compared to the traditional 2-Way DB-DPA, by avoiding early clipping in the main amplifiers, while benefiting from load-pulling from the auxiliary power amplifier. This improvement has been verified in theory and simulation at the CSRP, and in measurement with a fabricated 1.5 and 2-GHz dual-band PA. A statistical analysis using 2D CW signals with long-term evolution (LTE) probability distribution functions (PDF) was performed to demonstrate an improvement in the concurrent average efficiency by 15 percentage points compared to the conventional 2-Way DB-DPA. In concurrent operation, the 3-Way DB-DPA when driven by two 10-MHz LTE uncorrelated signals at 1.5 GHz with 6.86 dB PAPR and at 2.0 GHz with 6.26 dB PAPR was verified experimentally to deliver a total power of 37.5 dBm while providing an average concurrent drain efficiency of 54.24%. This corresponds to an improvement of about 15 percentage points compared to other reported dual-band PAs.

In an implementation, a dual-band Doherty power amplifier comprises a double-input and double-output power amplifier with a shared auxiliary power amplifier topology, comprising two main power amplifiers and 1 auxiliary power amplifier.

In an implementation, an N-band Doherty power amplifier comprises N inputs and N outputs with a shared auxiliary power amplifier topology, wherein N is an integer, and comprising N main power amplifiers and 1 auxiliary power amplifier.

In an implementation, an N-band Doherty power amplifier comprises N inputs and one output with a shared auxiliary power amplifier topology, wherein N is an integer, and comprising N main power amplifiers and 1 auxiliary power amplifier.

FIGS. 4-7 show drawings of additional embodiments for a multi-band Doherty power amplifier with N or 2N inputs and N outputs.

Figure 4:
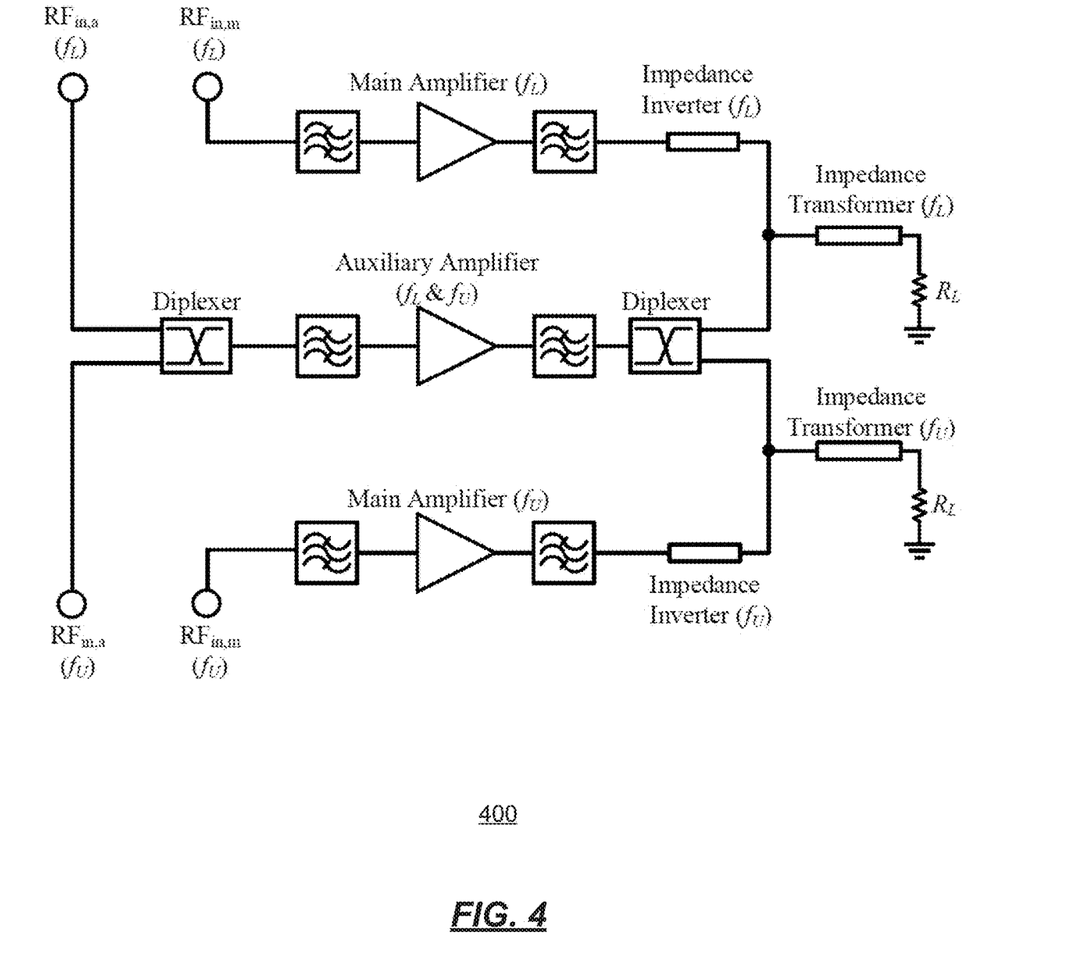
FIG. 4 illustrates a diagram of an implementation of a 3-Way DB-DPA with four inputs and two outputs.

FIG. 4 illustrates a diagram of an implementation of a 3-way DB-DPA 400 with four inputs and two outputs. More particularly, FIG. 4 shows a MIMO implementation using four different input channels to drive the PA and with two different outputs for the lower and upper bands of the dual-band Doherty PA.

Figure 5:
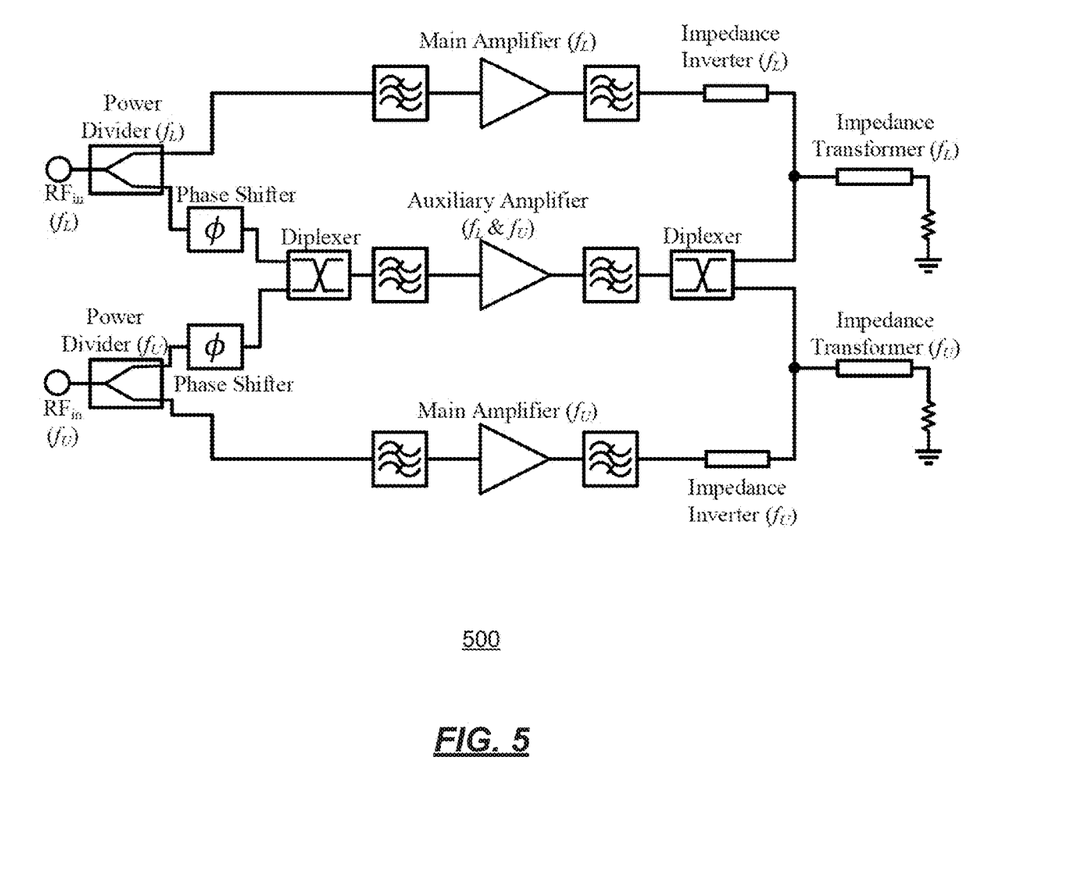
FIG. 5 illustrates a diagram of an implementation of a 3-Way DB-DPA with two inputs and two outputs.

FIG. 5 illustrates a diagram of an implementation of a 3-way DB-DPA 500 with two inputs and two outputs. More particularly, FIG. 5 shows a MIMO implementation using two different input channels to drive the PA and two different outputs for the lower and upper bands of the dual-band Doherty PA.

Figure 6:
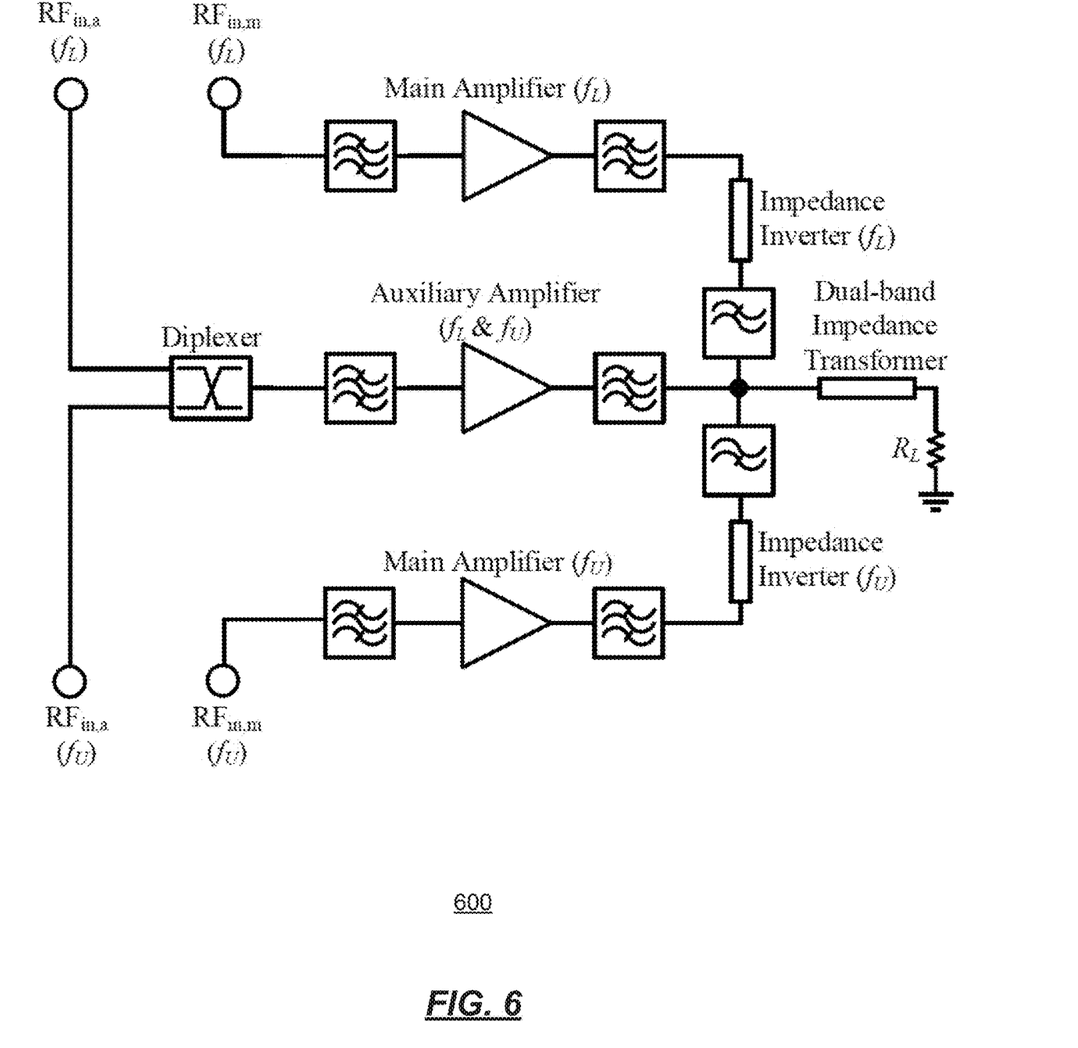
FIG. 6 illustrates a diagram of an implementation of a 3-Way DB-DPA with four inputs and one output.

FIG. 6 illustrates a diagram of an implementation of a 3-way DB-DPA 600 with four inputs and one output. More particularly, FIG. 6 shows a MIMO implementation using four different input channels to drive the PA and one single output for the dual-band Doherty PA.

Figure 7:
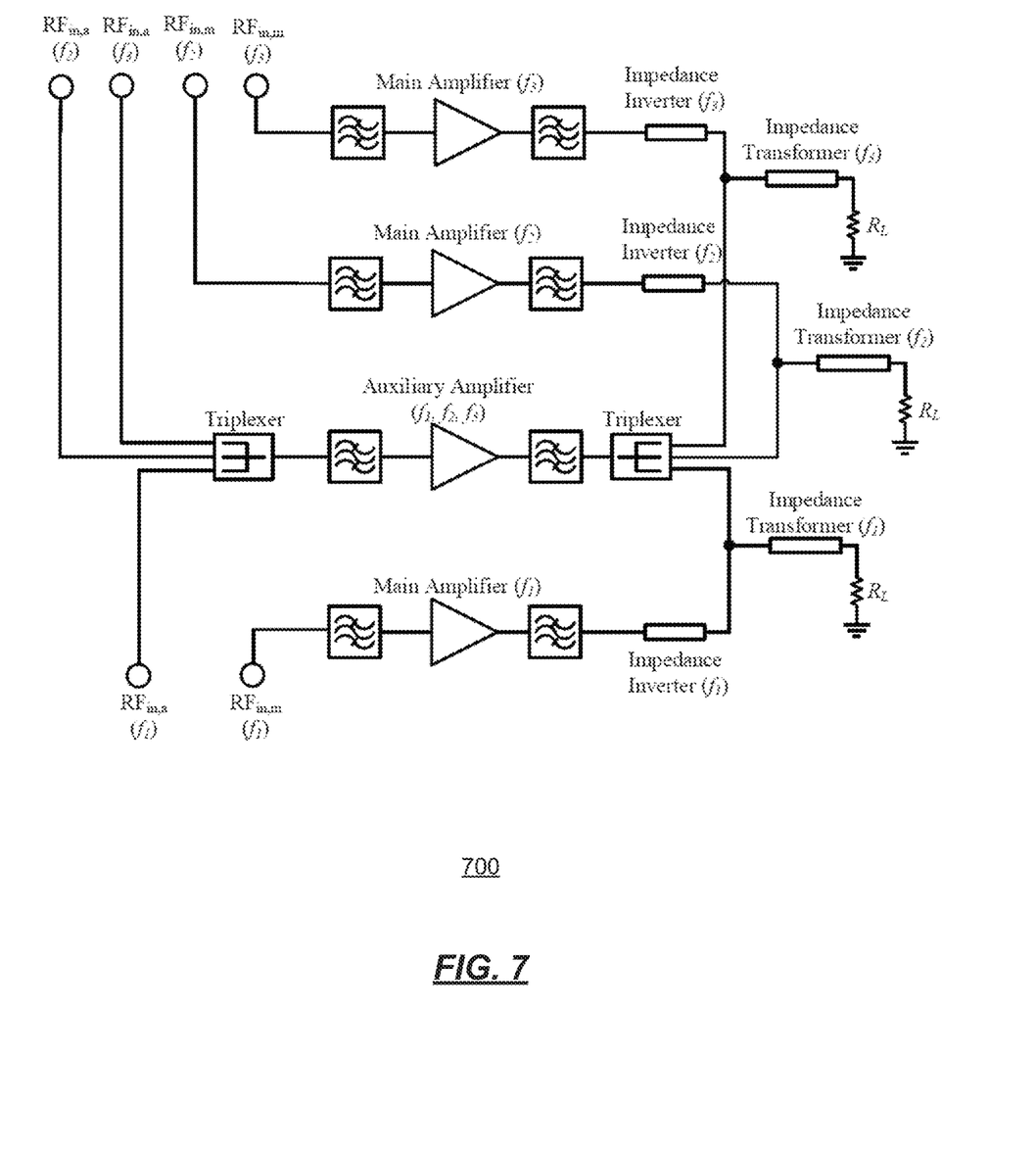
FIG. 7 illustrates a diagram of an implementation of a 3-Way DB-DPA with six inputs and three outputs.

FIG. 7 illustrates a diagram of an implementation of a 3-way DB-DPA 700 with six inputs and three outputs. More particularly, FIG. 7 shows a MIMO implementation using six different input channels to drive the PA and three different outputs corresponding to each of the band of this tri-band Doherty PA.

In an implementation, a dual-band Doherty power amplifier (DB-DPA) comprises: a first main amplifier for a first band; a second main amplifier for a second band; and an auxiliary amplifier configured to handle the first band and the second band.

Implementations may include some or all of the following features. Each main amplifier is a carrier amplifier, and the auxiliary amplifier is a peaking amplifier. The first main amplifier and the second main amplifier are configured to avoid early clipping. Each of the first main amplifier and the second main amplifier is configured to handle signals individually to avoid early clipping. The auxiliary amplifier is configured for load pulling. Each of the first main amplifier and the second main amplifier is a class F or B or J power amplifier, and wherein the auxiliary amplifier is a class C power amplifier. The DB-DPA further comprises a respective impedance inverter associated with each of the first main amplifier and the second main amplifier, wherein the impedance inverters of the first and second main amplifiers are integrated as part of an output combiner. The output combiner comprises a diplexer with low-pass and high-pass filters, wherein the diplexer is configured to distribute the lower-band and upper-band load-pull signals between the first and second main amplifiers so that no intermodulation products are created. The DB-DPA further comprises a dual-band impedance transformer integrated as part of the output combiner. The DB-DPA further comprises two Wilkinson power dividers (WPD) with uneven power ratio configured for each RF band to divide the input power between the first and second main amplifiers and the auxiliary amplifier. The DB-DPA further comprises, at the gate of each of the first and second main amplifiers, a matching network that includes a termination for the input second harmonic configured for the lower-band and upper-band signals. The DB-DPA further comprises two 90 degree phase shifters in the auxiliary branch after the WPDs, to compensate for the phase offset between the first and second main amplifiers and the auxiliary amplifier introduced by the inverters. The DB-DPA further comprises, after the phase shifters, a diplexer at the input of the auxiliary amplifier to combine both signals and prevent the lower-band signal from going to the upper-band main amplifier and vice versa. The DB-DPA further comprises a dual-band matching network that includes the termination of the lower-band and upper-band second harmonic at the gate of the auxiliary transistor.

In an implementation, an N-band Doherty power amplifier comprises N inputs and N outputs with a shared auxiliary power amplifier topology, wherein N is an integer, and comprises N main power amplifiers and 1 auxiliary power amplifier. In some implementations, N=2.

In an implementation, an N-band Doherty power amplifier comprises 2N inputs and N outputs with a shared auxiliary power amplifier topology, wherein N is an integer, and comprises N main power amplifiers and 1 auxiliary power amplifier. In some implementations, N=2. In some implementations, N=3.

As used herein, the singular form "a," "an," and "the" include plural references unless the context clearly dictates otherwise. As used herein, the terms "can," "may," "optionally," "can optionally," and "may optionally" are used interchangeably and are meant to include cases in which the condition occurs as well as cases in which the condition does not occur.

Ranges can be expressed herein as from "about" one particular value, and/or to "about" another particular value. When such a range is expressed, another embodiment includes from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint. It is also understood that there are a number of values disclosed herein, and that each value is also herein disclosed as "about" that particular value in addition to the value itself. For example, if the value "10" is disclosed, then "about 10" is also disclosed.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed:

1. A dual-band Doherty power amplifier (DB-DPA) comprising:
   a first main amplifier for a first band;
   a second main amplifier for a second band;
   an auxiliary amplifier configured to handle the first band and the second band; and
   an output combiner configured to produce a single output, the output combiner comprising:
      a diplexer configured to distribute load-pull signals of the first band and the second band so that no intermodulation products are created;
      a first impedance inverter associated with the first main amplifier and a second impedance inverter associated with the second main amplifier; and
      a dual-band impedance transformer.

2. The DB-DPA of claim 1, wherein each main amplifier is a carrier amplifier, and the auxiliary amplifier is a peaking amplifier.

3. The DB-DPA of claim 1, wherein the first main amplifier and the second main amplifier are configured to avoid early clipping.

4. The DB-DPA of claim 3, wherein each of the first main amplifier and the second main amplifier is configured to handle signals individually to avoid early clipping.

5. The DB-DPA of claim 1, wherein the auxiliary amplifier is configured for load pulling.

6. The DB-DPA of claim 1, wherein each of the first main amplifier and the second main amplifier is a class F or B or J power amplifier, and wherein the auxiliary amplifier is a class C power amplifier.

7. The DB-DPA of claim 1, further comprising two Wilkinson power dividers (WPD) with uneven power ratio configured for each RF band to divide the input power between the first and second main amplifiers and the auxiliary amplifier.

8. The DB-DPA of claim 7, further comprising, at a gate of each of the first and second main amplifiers, a matching network that includes a termination for the input second harmonic configured for the lower-band and upper-band signals.

9. The DB-DPA of claim 8, further comprising two 90 degree phase shifters in the auxiliary branch after the WPDs, to compensate for phase offset between the first and second main amplifiers and the auxiliary amplifier introduced by the inverters.

10. The DB-DPA of claim 9, further comprising, after the phase shifters, a diplexer at the input of the auxiliary amplifier to combine both signals and prevent the lower-band signal from going to the upper-band main amplifier and vice versa.

11. The DB-DPA of claim 10, further comprising a dual-band matching network that includes the termination of the lower-band and upper-band second harmonic at the gate of the auxiliary transistor.

12. An N-band Doherty power amplifier comprising N inputs and N outputs with a shared auxiliary power amplifier topology, wherein N is an integer, and comprising N main power amplifiers an auxiliary power amplifier, and wherein the N-band Doherty power amplifier further comprises an output combiner configured to produce a single output, the output combiner comprising:
   an N-band multiplexer configured to distribute load-pull signals of the N main power amplifiers so that no intermodulation products are created;
   an impedance inverter associated with each of the of the N main power amplifiers; and
   an N-band impedance transformer.

13. The N-band Doherty power amplifier of claim 12, wherein N=2.

14. An N-band Doherty power amplifier comprising:
   2N inputs;
   N outputs with a shared auxiliary power amplifier topology, wherein N is an integer, and comprising N main power amplifiers and an auxiliary power amplifier; and
   an output combiner configured to produce a single output, the output combiner comprising:
      an N-band multiplexer configured to distribute load-pull signals of the N main power amplifiers so that no intermodulation products are created;
      an impedance inverter associated with each of the N main power amplifiers; and
      an N-band impedance transformer.

15. The N-band Doherty power amplifier of claim 14, wherein N=2.

16. The N-band Doherty power amplifier of claim 14, wherein N=3.

* * * * *